(12) United States Patent
Aoki et al.

(10) Patent No.: US 9,648,739 B2
(45) Date of Patent: May 9, 2017

(54) ELECTRONIC COMPONENT MOUNTING STRUCTURE AND PRINTED WIRING BOARD

(71) Applicant: CANON KABUSHIKI KAISHA, Tokyo (JP)

(72) Inventors: Takashi Aoki, Urayasu (JP); Yasuhiro Sawada, Chofu (JP)

(73) Assignee: CANON KABUSHIKI KAISHA, Tokyo (JP)

(*) Notice: Subject to any disclaimer, the term of this patent is extended or adjusted under 35 U.S.C. 154(b) by 148 days.

(21) Appl. No.: 14/558,614

(22) Filed: Dec. 2, 2014

(65) Prior Publication Data
US 2015/0173195 A1 Jun. 18, 2015

(30) Foreign Application Priority Data

Dec. 18, 2013 (JP) .................... 2013-261587

(51) Int. Cl.
*H05K 1/18* (2006.01)
*H05K 1/11* (2006.01)
(Continued)

(52) U.S. Cl.
CPC ............ *H05K 1/111* (2013.01); *H05K 1/0243* (2013.01); *H05K 3/3442* (2013.01); *H05K 2201/0979* (2013.01); *H05K 2201/09272* (2013.01); *H05K 2201/09427* (2013.01); *H05K 2201/09727* (2013.01); *H05K 2201/10015* (2013.01);
(Continued)

(58) Field of Classification Search
CPC ......... H05K 1/111; H05K 2201/09427; H05K 2201/09727
See application file for complete search history.

(56) References Cited

U.S. PATENT DOCUMENTS 4,874,907 A * 10/1989 Ishikawa ............ G01R 31/2818
174/261
6,566,611 B2 * 5/2003 Kochanowski ........ H05K 1/111
174/260
(Continued)

FOREIGN PATENT DOCUMENTS

JP 05102621 A 4/1993
JP 07183627 A 7/1995
(Continued)

*Primary Examiner* — William H Mayo, III
*Assistant Examiner* — Hiram E Gonzalez
(74) *Attorney, Agent, or Firm* — Fitzpatrick, Cella, Harper & Scinto

(57) ABSTRACT

An electronic component mounting structure includes a first land, a second land making a pair with the first land, an electronic component having a chip shape and including a first electrode connected to the first land and a second electrode connected to the second land, a first wiring pattern connected to the first land, and a second wiring pattern connected to the second land and including a first partial pattern overlapping a portion of a body of the electronic component in planar view, the portion being not covered with the pair of electrodes, a second partial pattern formed integral with the first partial pattern and overlapping the first electrode of the electronic component in planar view, and a third partial pattern formed integral with the second partial pattern and parallel to the first wiring pattern.

7 Claims, 10 Drawing Sheets

(51) Int. Cl.
*H05K 1/02* (2006.01)
*H05K 3/34* (2006.01)

(52) U.S. Cl.
CPC .............. *H05K 2201/10636* (2013.01); *H05K 2201/10651* (2013.01); *Y02P 70/611* (2015.11)

(56) References Cited

U.S. PATENT DOCUMENTS

| | | |
|---|---|---|
| 7,368,819 B2 | 5/2008 | Sawada |
| 7,697,582 B2 | 4/2010 | Aoki |
| 8,039,758 B2 * | 10/2011 | Ogawa .................... H05K 1/111 174/260 |
| 9,159,658 B2 * | 10/2015 | Oberschmid ..... H01L 23/49811 |
| 9,159,670 B2 * | 10/2015 | Kim ...................... H01L 21/768 |
| 2009/0115073 A1 * | 5/2009 | Sunohara ............. H05K 1/0271 257/778 |
| 2014/0144688 A1 * | 5/2014 | Choi ...................... H05K 1/111 174/260 |

FOREIGN PATENT DOCUMENTS

| | | | |
|---|---|---|---|
| JP | 2005-085807 A | 3/2005 | |
| JP | 4829998 B2 | 12/2011 | |

* cited by examiner

ELECTRONIC COMPONENT MOUNTING STRUCTURE AND PRINTED WIRING BOARD

BACKGROUND OF THE INVENTION

Field of the Invention

The present invention relates to an electronic component mounting structure and printed wiring board.

Description of the Related Art

To stabilize the power supply voltage and reduce switching noise, a power line has conventionally been decoupled by using a chip capacitor or the like.

When the length of a wiring pattern connecting the capacitor and a semiconductor element increases, the parasitic inductance increases, and this makes it impossible to sufficiently effectively perform decoupling.

Accordingly, the parasitic inductance is reduced by arranging the capacitor near the semiconductor element, thereby effectively reducing the switching noise.

Related references are as follows:

Japanese Patent No. 4829998;
Japanese Patent Application Laid-Open No. H07-183627;
Japanese Patent Application Laid-Open No. H05-102621; and
Japanese Patent Application Laid-Open No. 2005-85807.

SUMMARY OF THE INVENTION

According to an aspect of the present invention, there is provided an electronic component mounting structure including a first land formed on a printed wiring board; a second land formed on the printed wiring board and making a pair with the first land; an electronic component having a chip shape and including a pair of electrodes formed on both sides of a body, a first electrode as one of the pair of electrodes being connected to the first land, and a second electrode as the other one of the pair of electrodes being connected to the second land; a first wiring pattern connected to the first land; and a second wiring pattern connected to the second land and including a first partial pattern overlapping a portion of the body of the electronic component in planar view, the portion being not covered with the pair of electrodes, a second partial pattern formed integral with the first partial pattern and overlapping the first electrode of the electronic component in planar view, and a third partial pattern formed integral with the second partial pattern and parallel to the first wiring pattern.

According to another aspect of the present invention, there is provided a printed wiring board including a first land to be connected to a first electrode of one of a pair of electrodes formed on both sides of a body of an electronic component having a chip shape when the electronic component is mounted; a second land making a pair with the first land, the second land being connected to a second electrode as the other one of the pair of electrodes when the electronic component is mounted; a first wiring pattern connected to the first land; and a second wiring pattern connected to the second land and including a first partial pattern formed to overlap a portion of the body of the electronic component in planar view, the portion being not covered with the pair of electrodes, a second partial pattern formed integral with the first partial pattern and formed so as to overlap the first electrode of the electronic component in planar view, and a third partial pattern formed integral with the second partial pattern and parallel to the first wiring pattern.

Further features of the present invention will become apparent from the following description of exemplary embodiments with reference to the attached drawings.

DESCRIPTION OF THE EMBODIMENTS

Recently, the switching noise tends to increase in accordance with the operation frequencies of electronic apparatuses being increased. Also, in accordance with the power supply voltage being decreased, demands have arisen for further reducing the switching noise.

Figure 9A:
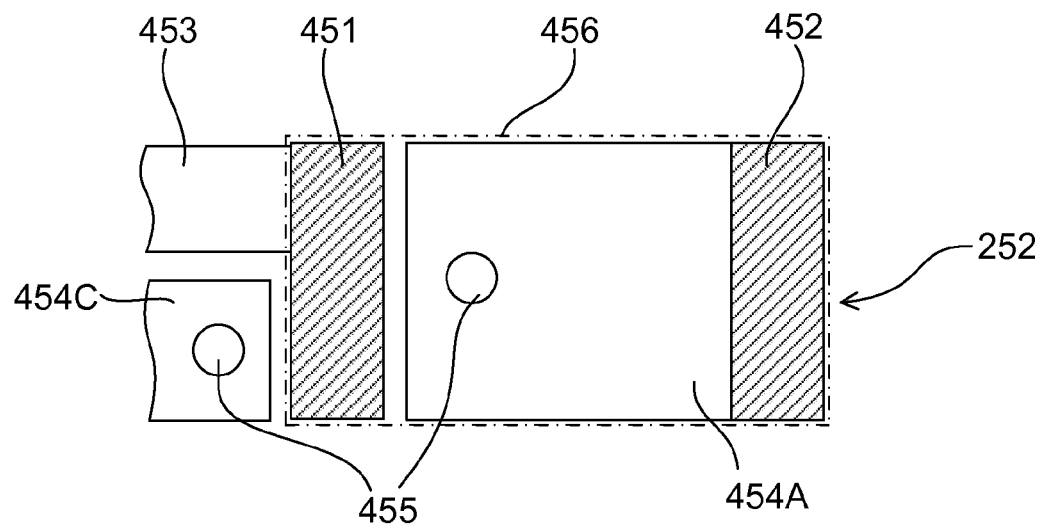
FIGS. 9A, 9B and 9C are plan views illustrating an electronic component mounting structure according to a reference example.
Figure 9B:
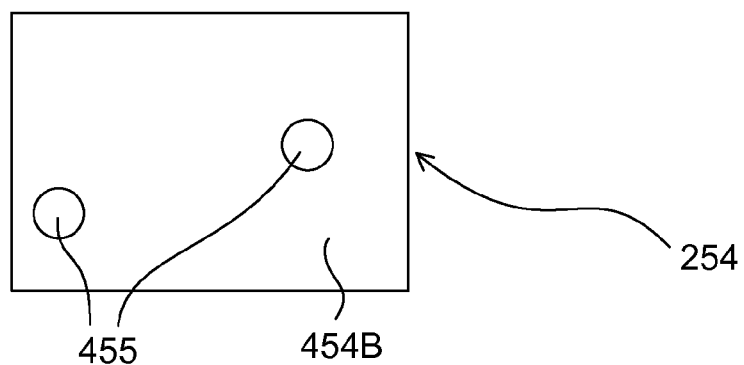
Figure 9C:
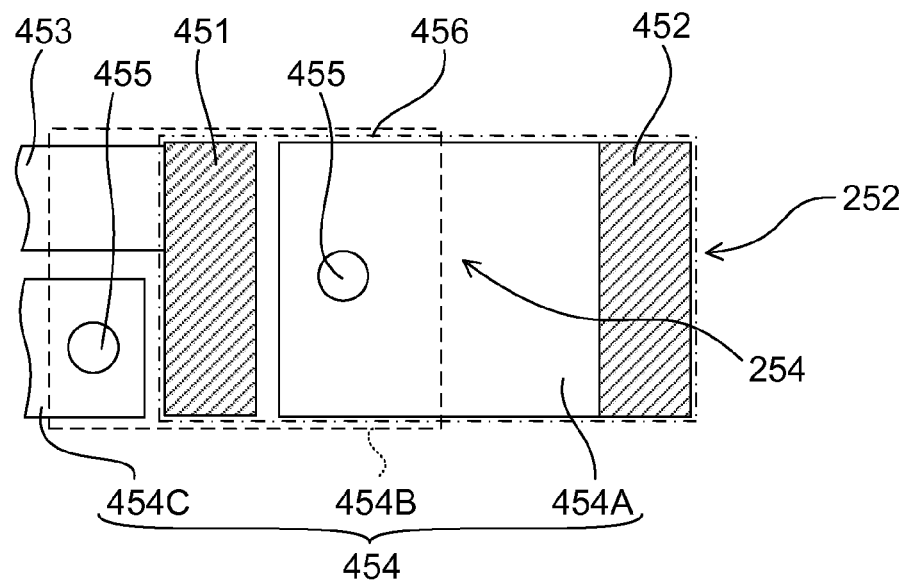
Figure 10:
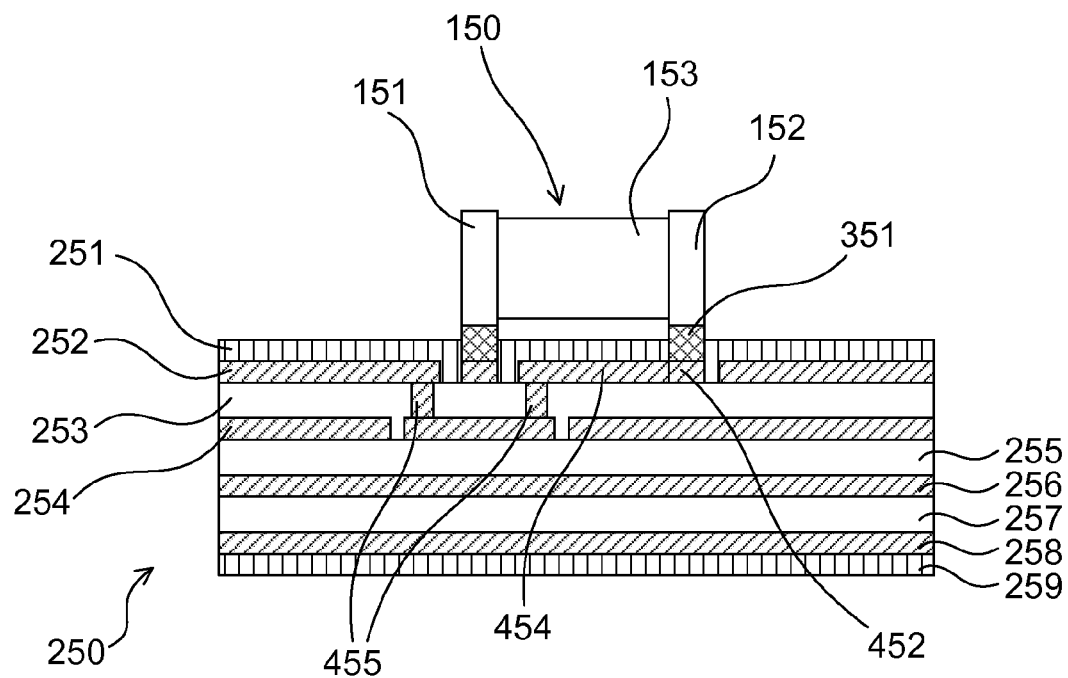
FIG. 10 is a sectional view illustrating the electronic component mounting structure according to the reference example.

An electronic component mounting structure according to a reference example will be explained with reference to FIGS. 9A to 9C and FIG. 10. FIGS. 9A to 9C are plan views illustrating the electronic component mounting structure according to the reference example. FIG. 10 is a sectional view illustrating the electronic component mounting structure according to the reference example. FIG. 9A illustrates patterns formed in an uppermost conductor layer 252. FIG. 9B illustrates patterns formed in a conductor layer 254 below the conductor layer 252. FIG. 9C illustrates patterns formed in the conductor layers 252 and 254.

A printed wiring board 250 has a structure in which conductor layers 252, 254, 256 and 258 are stacked with insulating layers 253, 255 and 257 formed therebetween. A pair of lands 451 and 452 are formed in the uppermost conductor layer 252. A first wiring pattern 453 is connected to the first land 451 as one of the pair of lands 451 and 452. A first pattern 454A is connected to the second land 452 as the other one of the pair of lands 451 and 452. A second pattern 454B is formed in the conductor layer 454 below the conductor layer 252. The first pattern 454A and the second pattern 454B are electrically connected by vias 455. A third pattern 454C is formed in the conductor layer 252. The second pattern 454B and the third pattern 454C are electrically connected by the vias 455. The second wiring pattern 454 is thus formed by the first pattern 454A, the second pattern 454B formed in the layer different from that of the first pattern 454A, and the third pattern 454C formed in the same layer as that of the first pattern 454A. The second pattern 454B is formed in the layer different from that of the first pattern 454A and the third pattern 454C in order to prevent a short-circuit between the first land 451 and the second wiring pattern 454.

As described above, the second pattern 454B is formed in the layer different from that of the first pattern 454A and the third pattern 454C so as to bypass the first land 451.

Solder resist films 251 and 259 are respectively formed on the upper and lower sides of the printed wiring board 250. An electronic component 150 with a pair of electrodes 151 and 152 formed on the both sides of a body (main body) 153 is mounted in an electronic component mounting region 456 on the printed wiring board 250. The first electrode 151 as one of the pair of electrodes 151 and 152 of the electronic component 150 is connected to the first land 451 via solder 351. The second electrode 152 as the other one of the pair of electrodes 151 and 152 of the electronic component 150 is connected to the second land 452 via solder 351.

In the electronic component mounting structure according to the reference example illustrated in FIGS. 9A to 9C and FIG. 10, a magnetic field generated by an electric current flowing through the first wiring pattern 453 and electronic component 150 and a magnetic field generated by an electric current flowing through the second wiring pattern 454 cancel out each other. Therefore, the electronic component mounting structure according to the reference example illustrated in FIGS. 9A to 9C and FIG. 10 can reduce the switching noise.

In the electronic component mounting structure according to the reference example illustrated in FIGS. 9A to 9C and FIG. 10, however, the second pattern 454B is formed in the layer different from that of the first pattern 454A and the third pattern 454C in order to bypass the first land 451. The via 455 for connecting the first pattern 454A and the second pattern 454B and the via 455 for connecting the second pattern 454B and the third pattern 454C increase the parasitic inductance. Especially in recent years, the electronic component 150 having a smaller size is used to meet demands for downsizing electronic apparatuses. Therefore, it is considered that only one via may be formed as each of the via 455 for connecting the first pattern 454A and the second pattern 454B, and the via 455 for connecting the second pattern 454B and the third pattern 454C. In this case, a large parasitic inductance is produced in the connecting portion between the first pattern 454A and the second pattern 454B, and the connecting portion between the second pattern 454B and the third pattern 454C. This large parasitic inductance obstructs effective decoupling. It is also possible to increase the width of the second pattern 454B in order to reduce the parasitic inductance. However, when the width of the second pattern 454B is increased, a space for forming other wiring patterns in the conductor layer 254 reduces.

Preferred embodiments of the present invention will now be described in detail in accordance with the accompanying drawings.

One Embodiment

Figure 1:
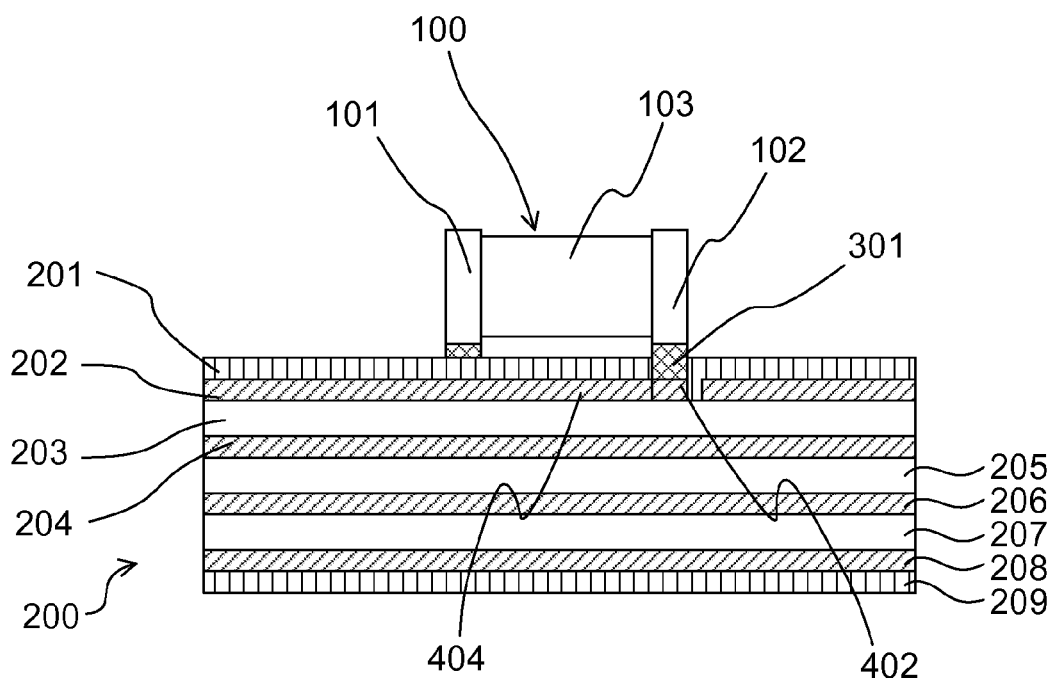
FIG. 1 is a sectional view illustrating an outline of an electronic component mounting structure according to one embodiment.
Figure 2:
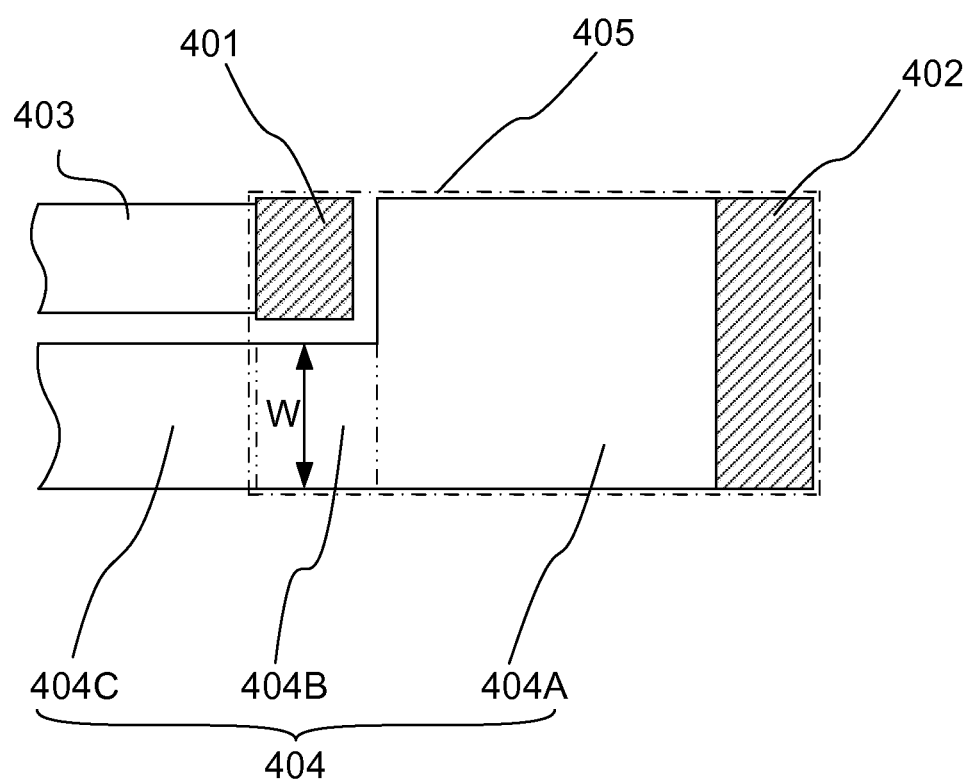
FIG. 2 is a plan view illustrating the electronic component mounting structure according to the embodiment.
Figure 3:
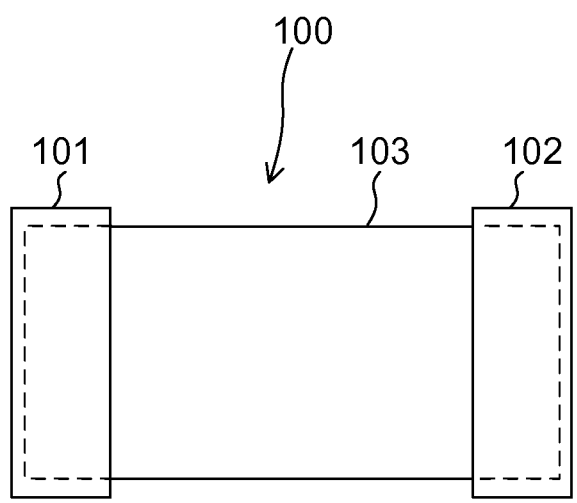
FIG. 3 is a plan view illustrating an electronic component.

An electronic component mounting structure according to one embodiment will be explained with reference to FIGS. 1 to 4. FIG. 1 is a sectional view illustrating an outline of the electronic component mounting structure according to the present embodiment. FIG. 2 is a plan view illustrating the electronic component mounting structure according to the present embodiment. FIG. 3 is a plan view illustrating an electronic component.

A printed wiring board 200 has a structure in which conductor layers 202, 204, 206, and 208 are stacked with insulating layers 203, 205, and 207 formed therebetween. The conductor layer 204 is positioned below the uppermost conductor layer 202. The insulating layer 203 is positioned between the conductor layer 202 and the conductor layer 204. The conductor layer 206 is positioned below the conductor layer 204. The insulating layer 205 is positioned between the conductor layer 204 and the conductor layer 206. The conductor layer 208 is positioned below the conductor layer 206. The insulating layer 207 is positioned between the conductor layer 206 and the conductor layer 208. The upper and lower sides of the printed wiring board 200 are respectively covered with resist films 201 and 209, i.e., solder resist films 201 and 209. Wiring patterns and the like are respectively formed in the conductor layers 202, 204, 206, and 208. These wiring patterns formed in the conductor layers 202, 204, 206, and 208 are connected each other as needed by, e.g., vias buried in the insulating layers 203, 205, and 207.

An electronic component 100 is mounted on the printed wiring board 200. The electronic component 100 is mounted in a region 405 of the printed wiring board 200 where an electronic component is to be mounted, i.e., in an electronic component mounting region 405. The electronic component 100 is, e.g., an electronic component having a chip shape (chip electronic component). In other words, the electronic component 100 is a surface-mounting electronic component. More specifically, the electronic component 100 is, e.g., a capacitor having a chip shape, i.e., a chip capacitor.

The planar shape of the electronic component mounting region 405 is equivalent to that of the electronic component 100.

The electronic component 100 has a structure in which a pair of electrodes 101 and 102 are formed on the both sides of a body 103, i.e., a body portion 103. The first electrode 101 as one of the pair of electrodes 101 and 102 is formed on one side of the body 103. The second electrode 102 as the other one of the pair of electrodes 101 and 102 is formed on the other side of the body 103. The pair of electrodes 101 and 102 of the electronic component 100 are arranged on the short sides of the electronic component 100. The longitudinal direction of the electronic component 100, i.e., the left and right direction as viewed in the drawing of FIG. 2 matches a direction connecting the first electrode 101 and the second electrode 102.

A pair of lands 401 and 402, a first wiring pattern 403, and a second wiring pattern 404 are formed in the uppermost conductor layer 202, i.e., the outermost conductor layer 202. In other words, the pair of lands 401 and 402 and the first wiring pattern 403 and the second wiring pattern 404 are formed on one major surface (a surface of one side, a surface) of the printed wiring board 200.

The first electrode 101 of the electronic component 100 is connected to the first land 401 of the pair of lands 401 and 402. The first land 401 is formed on one side of the electronic component mounting region 405. At least a portion of the first land 401 is positioned inside the electronic component mounting region 405.

The second electrode 102 of the electronic component 100 is connected to the second land 402 of the pair of lands 401 and 402. The second land 402 is formed on the other side of the electronic component mounting region 405. At least a portion of the second land 402 is positioned inside the electronic component mounting region 405.

The longitudinal direction of the second land 402 is the up and down direction as viewed in the drawing of FIG. 2, i.e., the direction perpendicular to the longitudinal direction of the electronic component mounting region 405.

The dimension of the first land 401 in the up and down direction as viewed in the drawing of FIG. 2 is set smaller than the dimension of the second land 402 in the longitudinal direction of the second land 402, i.e., the dimension of the second land 402 in the up and down direction as viewed in the drawing of FIG. 2.

The first land 401 is connected to the first electrode 101 of the electronic component 100 via solder 301. The second land 402 is connected to the second electrode 102 of the electronic component 100 via solder 301.

The first wiring pattern 403 is connected to the first land 401. The first land 401 and first wiring pattern 403 are formed integrally. A portion of a conductive pattern including the first wiring pattern 403 and first land 401, which is not covered with the resist layer 201, is the first land 401. A portion of the conductive pattern including the first wiring pattern 403 and the first land 401, which is covered with the resist layer 201, is the first wiring pattern 403. The longitudinal direction of a portion of the first wiring pattern 403, which is connected to the first land 401, matches the longitudinal direction of the electronic component mounting region 405, i.e., the left and right direction as viewed in the drawing of FIG. 2.

The second wiring pattern 404 is connected to the second land 402. The second land 402 and second wiring pattern 404 are formed integrally. A portion of a conductive pattern including the second wiring pattern 404 and the second land 402, which is not covered with the resist layer 201, is the second land 402. A portion of the conductive pattern including the second wiring pattern 404 and the second land 402, which is covered with the resist layer 201, is the second wiring pattern 404.

The second wiring pattern 404 includes a first partial pattern 404A connected to the second land 402. One side of the first partial pattern 404A is connected to the second land 402. The other side of the first partial pattern 404A is connected to a second partial pattern 404B which is to be described later. The first partial pattern 404A is formed integral with the second land 402. At least a portion of the first partial pattern 404A, which is not covered with the pair of electrodes 101 and 102, is so formed as to overlap a portion of the body 103 of the electronic component 100 in planar view. The dimension (width) of the first partial pattern 404A in the up and down direction as viewed in the drawing of FIG. 2 is set equivalent to the dimension (width) of the second land 402 in the up and down direction as viewed in the drawing of FIG. 2.

The second wiring pattern 404 further includes the second partial pattern 404B connected to the first partial pattern 404A. One side of the second partial pattern 404B is connected to the first partial pattern 404A. The other side of the second partial pattern 404B is connected to a third partial pattern 404C which is to be described later. The second partial pattern 404B is formed integral with the first partial pattern 404A. At least a portion of the second partial pattern 404B is so formed as to overlap the first electrode 101 of the electronic component 100 in planar view. A dimension W of the second partial pattern 404B in the up and down direction as viewed in the drawing of FIG. 2 is set smaller than the dimension (width) of the second land 402 and the dimension (width) of the first partial pattern 404A in the up and down direction as viewed in the drawing of FIG. 2.

The second wiring pattern 404 further includes the third partial pattern 404C connected to the second partial pattern 404B. One side of the third partial pattern 404C is connected to the second partial pattern 404B. At least a portion of the third partial pattern 404C is parallel to the first wiring pattern 403. The third partial pattern 404C is formed integral with the second partial pattern 404B. The dimension (width) of the third partial pattern 404C in the up and down direction as viewed in the drawing of FIG. 2 is set equivalent to the dimension (width) of the second partial pattern 404B in the up and down direction as viewed in the drawing of FIG. 2.

Note that the dimension (width) of the third partial pattern 404C in the up and down direction as viewed in the drawing of FIG. 2 and the dimension (width) of the second partial pattern 404B in the up and down direction as viewed in the drawing of FIG. 2 need not be set equivalent to each other. The dimension (width) of the third partial pattern 404C in the up and down direction as viewed in the drawing of FIG. 2 and the dimension (width) of the second partial pattern 404B in the up and down direction as viewed in the drawing of FIG. 2 may also be different from each other.

In the present embodiment as described above, the dimension of the first land 401 in the up and down direction as viewed in the drawing of FIG. 2 is set smaller than the dimension of the second land 402 in the up and down direction as viewed in the drawing of FIG. 2. Also, the first partial pattern 404A of the second wiring pattern 404 electrically connected to the second land 402 overlaps, in planar view, the portion of the body 103 of the electronic component 100, which is not covered with the pair of electrodes 101 and 102. Furthermore, the second partial pattern 404B of the second wiring pattern 404 overlaps the first electrode 101 of the electronic component 100 in planar view. The second partial pattern 404B is formed in the same layer as that of the first partial pattern 404A and the third partial pattern 404C, and formed integral with the first partial pattern 404A and the third partial pattern 404C.

Figure 4:
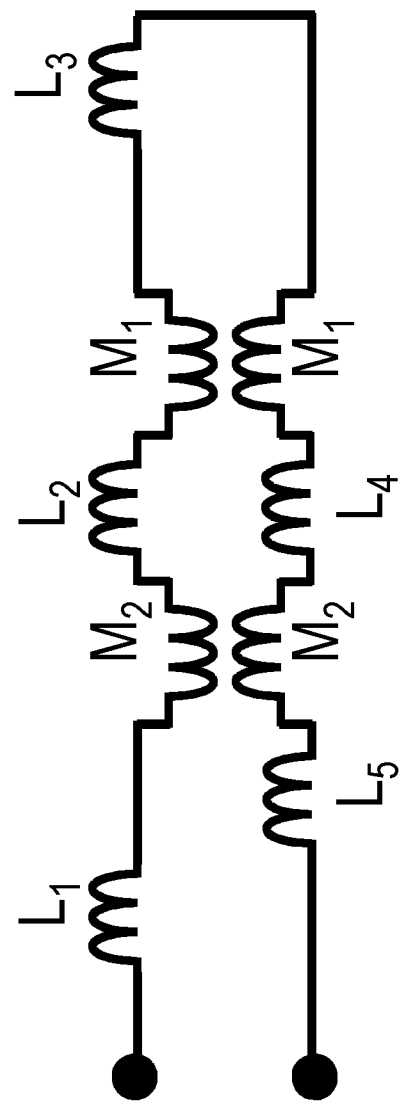
FIG. 4 is an equivalent circuit diagram illustrating the parasitic inductance of the electronic component mounting structure according to the embodiment.

FIG. 4 is an equivalent circuit diagram illustrating the parasitic inductance of the electronic component mounting structure according to the present embodiment.

$L_1$ represents a self-inductance of the first land 401. $L_2$ represents a self-inductance of the electronic component 100, i.e., the chip capacitor 100. $L_3$ represents a self-inductance of the second land 402. $L_4$ represents a self-inductance of the first partial pattern 404A of the second wiring pattern 404. $L_5$ is a self-inductance of the second partial pattern 404B of the second wiring pattern 404. $M_1$ represents a mutual inductance between the electronic component 100 and the first partial pattern 404A of the second wiring pattern 404. $M_2$ represents a mutual inductance between the electronic component 100 and the second partial pattern 404B of the second wiring pattern 404.

A parasitic inductance L of the electronic component mounting structure according to the present embodiment is represented by following formula (1). In the formula (1), $(L_2-M_1-M_2)$ represents the parasitic inductance of the electronic component 100. In the formula (1), $(L_4-M_1)$ is the parasitic inductance of the second partial pattern 404A of the first wiring pattern 404. In formula (1), $(L_5-M_2)$ represents the parasitic inductance of the second partial pattern 404B of the second wiring pattern 404.

$$L=L_1+(L_2-M_1-M_2)+L_3+(L_4-M_1)+(L_5-M_2) \quad (1)$$

A parasitic inductance L' of the electronic component mounting structure according to the reference example illustrated in FIGS. 9A to 9C and FIG. 10 is represented by following formula (2). In formula (2), $(L'_2-M'_1)$ represents the parasitic inductance of the electronic component 150, i.e., the chip capacitor 150. In formula (2), $(L'_4-M'_1)$ represents the parasitic inductance of the second wiring pattern 454.

$$L'=L'_1+(L'_2-M'_1)+L'_3+(L'_4-M'_1) \qquad (2)$$

In the present embodiment, the dimension (width) of the first land 401 in the up and down direction as viewed in the drawing of FIG. 2 is smaller than the dimension (width) of the first land 451 in the up and down direction as viewed in the drawing of FIG. 9A. The self-inductance increases as the pattern width decreases. Therefore, the self-inductance $L_1$ of the first land 401 according to the present embodiment is larger than the self-inductance $L'_1$ of the first land 451 according to the reference example illustrated in FIGS. 9A to 9C and FIG. 10.

On the other hand, in the present embodiment, the second partial pattern 404B of the second wiring pattern 404 overlaps the first electrode 101 of the electronic component 100 in planar view. In the present embodiment, therefore, a mutual inductance $M_2$ is produced between the first electrode 101 of the electronic component 100 and the second partial pattern 404B of the second wiring pattern 404. Accordingly, the parasitic inductance $(L_2-M_1-M_2)$ of the electronic component 100 according to the present embodiment is smaller than the parasitic inductance $(L'_2-M'_1)$ of the electronic component 150 according to the reference example illustrated in FIGS. 9A to 9C and FIG. 10. Also, the parasitic inductance $[(L_4-M_1)+(L_5-M_2)]$ of the second wiring pattern 404 according to the present embodiment is smaller than the parasitic inductance $(L'_4-M'_1)$ of the second wiring pattern 454 according to the reference example illustrated in FIGS. 9A to 9C and FIG. 10.

The amount of parasitic inductance reduced by the mutual inductance $M_2$ between the first electrode 101 of the electronic component 100 and the second partial pattern 404B of the second wiring pattern 404 is larger than the amount of parasitic inductance increased by decreasing the width of the first land 401. Therefore, the first embodiment can reduce the parasitic inductance of the electronic component mounting structure.

In the present embodiment as described above, a magnetic field generated by an electric current flowing through the first wiring pattern 403 and electronic component 100 and a magnetic field generated by an electric current flowing through the second wiring pattern 404 cancel out each other. In addition, the second partial pattern 404B overlaps the first electrode 101 of the electronic component 100 in planar view. Furthermore, the second partial pattern 404B is formed integral with the first partial pattern 404A and the third partial pattern 404C. Therefore, the parasitic inductance of the electronic component mounting structure is small. The switching noise can reliably be reduced because, as described above, the magnetic field generated by the electric current flowing through the first wiring pattern 403 and electronic component 100 and the magnetic field generated by the electric current flowing through the second wiring pattern 404 cancel out each other, and the parasitic inductance is small.

Modification 1

Figure 5:
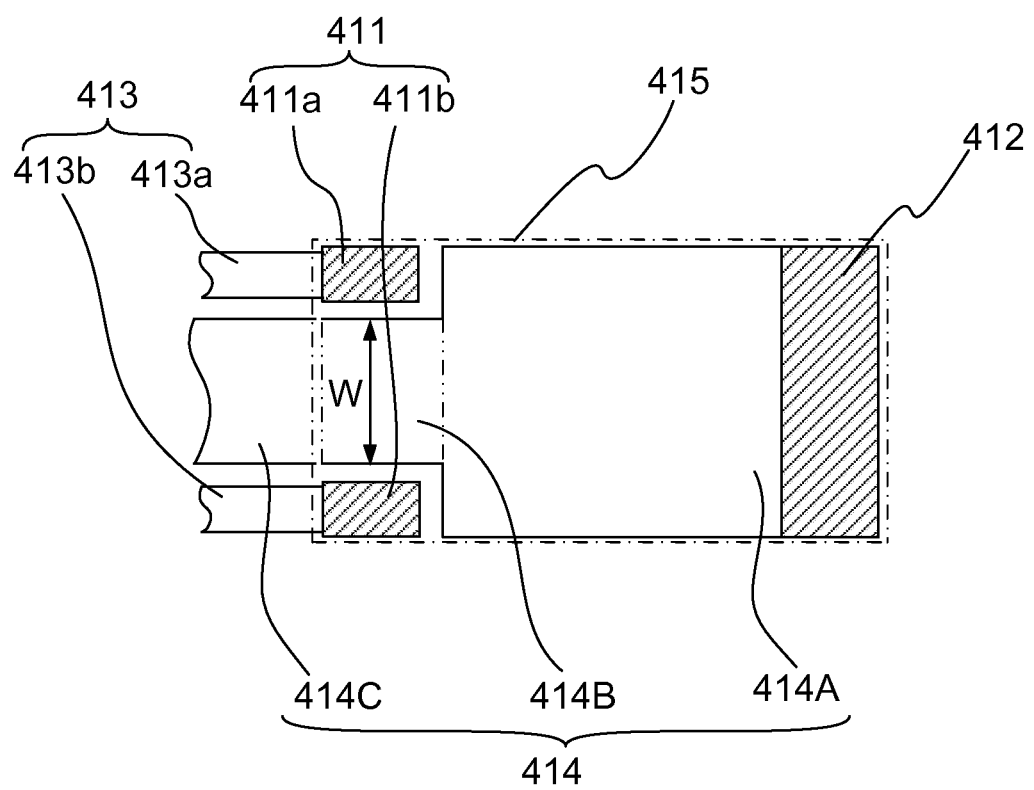
FIG. 5 is a plan view illustrating an electronic component mounting structure according to modification 1 of the embodiment.

Next, an electronic component mounting structure according to a modification 1 of the present embodiment will be explained with reference to FIG. 5. FIG. 5 is a plan view illustrating the electronic component mounting structure according to the present modification.

In the electronic component mounting structure according to the present modification, a first land 411 is divided into two divided patterns 411a and 411b, and a second partial pattern 414B of a second wiring pattern 414 is positioned between the two divided patterns 411a and 411b.

As illustrated in FIG. 5, the first land 411 is divided into the divided pattern 411a and the divided pattern 411b. Also, a first wiring pattern 413 is divided into the divided pattern 413a and the divided pattern 413b. The divided pattern 413a of the first wiring pattern 413 is connected to the divided pattern 411a of the first land 411. The divided pattern 413b of the first wiring pattern 413 is connected to the divided pattern 411b of the first land 411. The divided pattern 413b of the first wiring pattern 413 and the divided pattern 411b of the first land 411 are formed integrally. The divided pattern 413a of the first wiring pattern 413 and the divided pattern 413b of the first wiring pattern 413 are electrically connected by a portion not illustrated in FIG. 5. The sum total of the dimensions (widths) of the divided patterns 411a and 411b of the first land 411 in the up and down direction as viewed in the drawing of FIG. 5 is set smaller than the dimension of a second land 412 in the up and down direction as viewed in the drawing of FIG. 5.

The second wiring pattern 414 includes a first partial pattern 414A connected to the second land 412. At least a portion of the first partial pattern 414A of the second wiring pattern 414, which is not covered with the pair of electrodes 101 and 102, is so formed as to overlap a portion of the body 103 of the electronic component 100 in planar view. The dimension (width) of the first partial pattern 414A in the up and down direction as viewed in the drawing of FIG. 5 is set equivalent to the dimension (width) of the second land 412 in the up and down direction as viewed in the drawing of FIG. 5.

The second wiring pattern 414 further includes the second partial pattern 414B connected to the first partial pattern 414A. At least a portion of the second partial pattern 414B of the second wiring pattern 414 is so formed as to overlap the first electrode 101 of the electronic component 100 in planar view. A dimension (width) W of the second partial pattern 414B in the up and down direction as viewed in the drawing of FIG. 5 is set smaller than the dimension (width) of the second land 412 in the up and down direction as viewed in the drawing of FIG. 5. The second partial pattern 414B is positioned between the divided pattern 411a of the first land 411 and the divided pattern 411b of the first land 411.

The second wiring pattern 414 further includes a third partial pattern 414C connected to the second partial pattern 414B. At least a portion of the third partial pattern 414C is parallel to the first wiring pattern 413. The dimension (width) of the third partial pattern 414C in the up and down direction as viewed in the drawing of FIG. 5 is set equivalent to the dimension (width) of the second partial pattern 414B in the up and down direction as viewed in the drawing of FIG. 5.

The central line of the first partial pattern 414A along the left and right direction as viewed in the drawing of FIG. 5, the central line of the second partial pattern 414B along the left and right direction as viewed in the drawing of FIG. 5, and the central line of the third partial pattern 414C along the left and right direction as viewed in the drawing of FIG. 5 match each other. The central line along the left and right direction as viewed in the drawing of FIG. 5 of the second wiring pattern 414 including the first partial pattern 414A, the second partial pattern 414B and the third partial pattern 414C matches the central line of an electronic component mounting region 415 along the longitudinal direction thereof.

In a high-frequency range, an electric current flowing through an wiring pattern tend to concentrate to the peripheral portion of the wiring pattern. Therefore, a high-frequency noise current flowing through the first partial pattern 414A presumably concentrates to the peripheral portion of the first partial pattern 414A. As described above, the central line of the first partial pattern 414A along the left and right direction as viewed in the drawing of FIG. 5 matches the central line of the second partial pattern 414B along the left and right direction as viewed in the drawing of FIG. 5. Therefore, the path length of a noise current flowing along the peripheral portion of the first partial pattern 414A, which is illustrated in the upper side of FIG. 5 is equivalent to the path length of a noise current flowing along the peripheral portion of the first partial pattern 414A, which is illustrated in the lower side of FIG. 5.

Accordingly, the noise current flowing through the first partial pattern 414A is evenly distributed to the upper and lower sides on the drawing surface of FIG. 5. The parasitic inductance is minimized in this arrangement in which the noise current flowing through the first partial pattern 414A can evenly be distributed to the upper and lower sides of the drawing surface of FIG. 5.

Accordingly, the present modification can provide an electronic component mounting structure capable of reliably reducing high-frequency noise.

Modification 2

Figure 6:
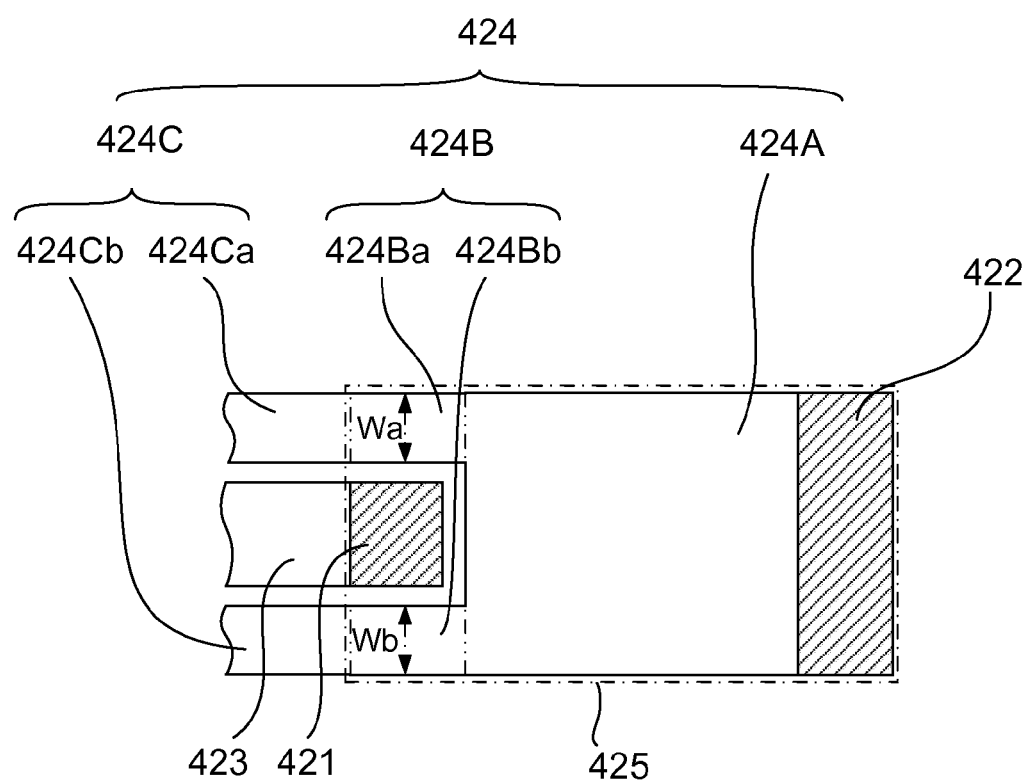
FIG. 6 is a plan view illustrating an electronic component mounting structure according to modification 2 of the embodiment.

An electronic component mounting structure according to a modification 2 of the present embodiment will be explained below with reference to FIG. 6. FIG. 6 is a plan view illustrating the electronic component mounting structure according to the present modification.

In the electronic component mounting structure according to the present modification, a second partial pattern 424B of a second wiring pattern 424 is divided into two divided patterns 424Ba and 424Bb, and a first land 421 is positioned between the two divided patterns 424Ba and 424Bb.

A first wiring pattern 423 is connected to the first land 421. The dimension of the land 421 in the up and down direction as viewed in the drawing of FIG. 6 is set smaller than the dimension of a land 422 in the up and down direction as viewed in the drawing of FIG. 6. The central line of the first wiring pattern 423 along the left and right direction as viewed in the drawing of FIG. 6 matches the central line of an electronic component mounting region 425 in the longitudinal direction thereof.

The second wiring pattern 424 includes a first partial pattern 424A connected to the second land 422. At least a portion of the first partial pattern 424A of the second wiring pattern 424, which is not covered with the pair of electrodes 101 and 102, is so formed as to overlap a portion of the body 103 of the electronic component 100 in planar view. The dimension (width) of the first partial pattern 424A in the up and down direction as viewed in the drawing of FIG. 6 is set equivalent to the dimension (width) of the second land 422 in the up and down direction as viewed in the drawing of FIG. 6. The central line of the second partial pattern 424A along the left and right direction as viewed in the drawing of FIG. 6 matches the central line of the first wiring pattern 423 along the left and right direction as viewed in the drawing of FIG. 6.

The second wiring pattern 424 further includes the second partial pattern 424B connected to the first partial pattern 424A. The second partial pattern 424B is divided into the divided pattern 424Ba and the divided pattern 424Bb. At least a portion of the divided pattern 424Ba is so formed as to overlap the first electrode 101 of the electronic component 100 in planar view. At least a portion of the divided pattern 424Bb is so formed as to overlap the first electrode 101 of the electronic component 100 in planar view. The sum of a dimension (width) Wa of the divided pattern 424Ba in the up and down direction as viewed in the drawing of FIG. 6 and a dimension (width) Wb of the divided pattern 424Bb in the up and down direction as viewed in the drawing of FIG. 6 is set smaller than the dimension (width) of the second land 422 in the up and down direction as viewed in the drawing of FIG. 6. The first land 421 is positioned between the divided pattern 424Ba and the divided pattern 424Bb.

The second wiring pattern 424 further includes a third partial pattern 424C connected to the second partial pattern 424B. The third partial pattern 424C is divided into divided pattern 424Ca and the divided pattern 424Cb. The divided pattern 424Ca of the third partial pattern 424C is connected to the divided pattern 424Ba of the second partial pattern 424B. The divided pattern 424Cb of the third partial pattern 424C is connected to the divided pattern 424Bb of the second partial pattern 424B. At least a portion of the third partial pattern 424C of the second wiring pattern 424 is parallel to the first wiring pattern 423. More specifically, at least a portion of the divided pattern 424Ca of the third partial pattern 424C is parallel to the first wiring pattern 423. Also, at least a portion of the divided pattern 424Cb of the third partial pattern 424C is parallel to the first wiring pattern 423. The dimension (width) of the divided pattern 424Ca in the up and down direction as viewed in the drawing of FIG. 6 is set equivalent to the dimension (width) of the divided pattern 424Ba in the up and down direction as viewed in the drawing of FIG. 6. The dimension (width) of the divided pattern 424Cb in the up and down direction as viewed in the drawing of FIG. 6 is set equivalent to the dimension (width) of the divided pattern 424Bb in the up and down direction as viewed in the drawing of FIG. 6.

As described previously, in a high-frequency range, an electric current flowing through an wiring pattern tends to concentrate to the peripheral portion of the wiring pattern. Therefore, it is considered that a high-frequency noise current flowing through the first partial pattern 424A concentrates to the peripheral portion of the first partial pattern 424A. In the present modification, the divided pattern 424Ba and the divided pattern 424Ca are formed along the peripheral portion of the first partial pattern 424A in the upper side of the drawing of FIG. 6. Also, the divided pattern 424Bb and the divided pattern 424Cb are formed along the peripheral portion of the first partial pattern 424A in the lower side of the drawing of FIG. 6. Therefore, according to the present modification, it is possible to shorten the path of the noise current, which extends from the second land 422 to the second partial pattern 424B via the first partial pattern 424A.

Accordingly, the present modification can provide an electronic component mounting structure capable of more reliably reducing high-frequency noise.

Modification 3

Figure 7:
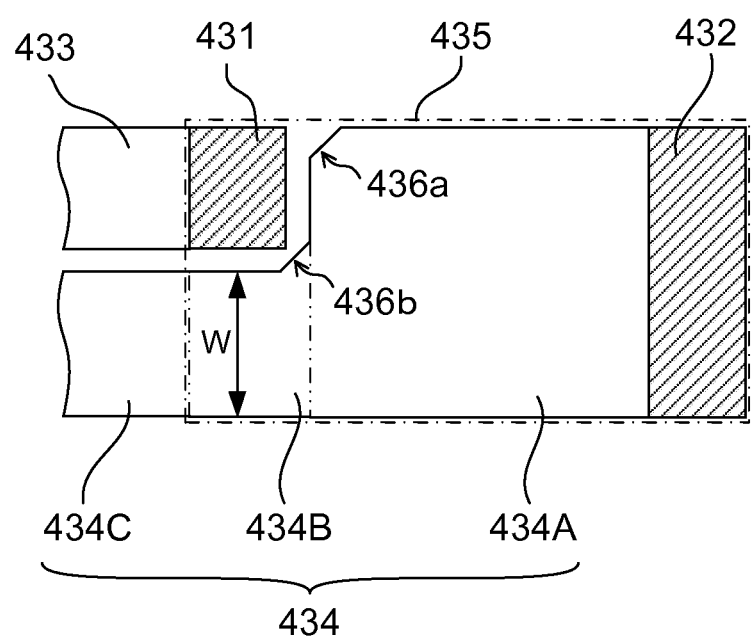
FIG. 7 is a plan view illustrating an electronic component mounting structure according to modification 3 of the embodiment.

An electronic component mounting structure according to a modification 3 of the present embodiment will now be explained with reference to FIG. 7. FIG. 7 is a plan view illustrating the electronic component mounting structure according to the present embodiment.

In the electronic component mounting structure according to the present modification, corner portions 436a and 436b of partial patterns 434A and 434B are formed obliquely to the longitudinal direction of an electronic component mounting region 435.

As illustrated in FIG. 7, a first wiring pattern 433 is connected to a first land 431. The dimension (width) of the first land 431 in the up and down direction as viewed in the drawing of FIG. 7 is set smaller than the dimension (width) of a second land 432 in the up and down direction as viewed in the drawing of FIG. 7.

A second wiring pattern 434 includes the first partial pattern 434A connected to the second land 432. At least a portion of the first partial pattern 434A, which is not covered with the pair of electrodes 101 and 102, is so formed as to overlap a portion of the body 103 of the electronic component 100 in planar view. The dimension (width) of the first partial pattern 434A in the up and down direction as viewed in the drawing of FIG. 7 is set equivalent to the dimension (width) of the second land 432 in the up and down direction as viewed in the drawing of FIG. 7. The corner portion 436a of the first partial pattern 434A is formed obliquely to the longitudinal direction of an electronic component mounting region 435.

The second wiring pattern 434 further includes the second partial pattern 434B connected to the first partial pattern 434A. At least a portion of the second partial pattern 434B is so formed as to overlap the first electrode 101 the electronic component 100 in planar view. A dimension (width) W of the partial pattern 434B in the up and down direction as viewed in the drawing of FIG. 7 is set smaller than the dimension (width) of the second land 432 in the up and down direction as viewed in the drawing of FIG. 7. The corner portion 436b positioned in the boundary between the first partial pattern 434A and the second partial pattern 434B is formed obliquely to the longitudinal direction of the electronic component mounting region 435.

The second wiring pattern 434 further includes a third partial pattern 434C connected to the second partial pattern 434B. At least a portion of the third partial pattern 434C is parallel to the first wiring pattern 433. The dimension (width) of the partial pattern 434C in the up and down direction as viewed in the drawing of FIG. 7 is set equivalent to the dimension (width) of the partial pattern 434B in the up and down direction as viewed in the drawing of FIG. 7.

A described above, in a high-frequency range, an electric current flowing through a wiring pattern tends to concentrate to the peripheral portion of the wiring pattern. Therefore, it is considered that an electric current flowing from the second land 432 to the third partial pattern 434C via the first partial pattern 434A and the second partial pattern 434B concentrates to the peripheral portions of the first partial pattern 434A and the second partial pattern 434B. In the present modification, the corner portion 436a of the first partial pattern 434A and the corner portion 436b positioned in the boundary between the first partial pattern 434A and the second partial pattern 434B are obliquely formed. Thus, according to the present modification, it is possible to shorten the path of a noise current, which extends from the second land 432 to the third partial pattern 434C via the first partial pattern 434A and the second partial pattern 434B.

Accordingly, the present modification can also provide an electronic component mounting structure capable of sufficiently reducing the parasitic inductance, and reliably reducing high-frequency noise.

(Evaluation Results)

Simulation was performed on the electronic component mounting structure according to an example, i.e., the electronic component mounting structure according to the modification 1 illustrated in FIG. 5. The dimensions of the constituent elements were set as follows. The dimension of the electronic component 100 in the up and down direction as viewed in the drawing of FIG. 3 was 0.8 mm. The dimension of the electronic component 100 in the left and right direction as viewed in the drawing of FIG. 3 was 1.6 mm. The dimension of each of the divided patterns 411a and 411b of the first land 411 in the up and down direction as viewed in the drawing of FIG. 5 was 0.25 mm. The dimension of each of the divided patterns 411a and 411b of the first land 411 in the left and right direction as viewed in the drawing of FIG. 5 was 0.3 mm. The dimension of the second land 412 in the up and down direction as viewed in the drawing of FIG. 5 was 0.8 mm. The dimension of the second land 412 in the left and right direction as viewed in the drawing of FIG. 5 was 0.3 mm. The dimension of the first partial pattern 414A in the up and down direction as viewed in the drawing of FIG. 5 was 0.8 mm. The dimension of the first partial pattern 414A in the left and right direction as viewed in the drawing of FIG. 5 was 0.9 mm. The dimension of the second partial pattern 414B in the up and down direction as viewed in the drawing of FIG. 5 was 0.1 mm. The dimension of the second partial pattern 414B in the left and right direction as viewed in the drawing of FIG. 5 was 0.4 mm. The Q3D Extractor (registered trademark) manufactured by Ansoft corporation was used as a simulator.

The results of the simulation were as follows. The parasitic inductance of the example, i.e., the parasitic inductance of the electronic component mounting structure illustrated in FIG. 5 was 378 pH. The parasitic inductance of the first land 411 was 56 pH. The parasitic inductance of the electronic component 100 was 142 pH. The parasitic inductance of the second land 412 was 48 pH. The parasitic inductance of the first partial pattern 414A of the second wiring pattern 414 was 53 pH. The parasitic inductance of the second partial pattern 414B of the second wiring pattern 414 was 127 pH.

Simulation was performed on the electronic component mounting structure according to the comparative example, i.e., the reference example illustrated in FIGS. 9A to 9C and FIG. 10. The dimensions of the constituent elements were set as follows. The dimension of the electronic component 150 in the up and down direction as viewed in the drawing of FIG. 9A was 0.8 mm. The dimension of the electronic component 150 in the left and right direction as viewed in the drawing of FIG. 9A was 1.6 mm. The dimension of the first land 451 in the up and down direction as viewed in the drawing of FIG. 9A was 0.8 mm. The dimension of the first land 451 in the left and right direction as viewed in the drawing of FIG. 9A was 0.3 mm. The dimension (width) of the second land 452 in the up and down direction as viewed in the drawing of FIG. 9A was 0.8 mm. The dimension of the second land 452 in the left and right direction as viewed in the drawing of FIG. 9A was 0.3 mm. The dimension of the partial pattern 454A in the up and down direction as viewed in the drawing of FIG. 9A was 0.8 mm. The dimension of the partial pattern 454A in the left and right direction as viewed in the drawing of FIG. 9A was 0.9 mm. The diameter of the via 455 was 0.1 mm. The height of the via 455 was 0.08 mm. The dimension of the partial pattern 454B in the up and down direction as viewed in the drawing of FIG. 9A was 1.3 mm. The dimension of the partial pattern 454B in the left and right direction as viewed in the drawing of FIG. 9A was 2.0 mm.

As a result of the simulation, the parasitic inductance of the electronic component mounting structure according to the comparative example, i.e., the reference example illustrated in FIGS. 9A to 9C and FIG. 10 was 413 pH.

The parasitic inductance of each of the first land 451 and the second land 452 was 48 pH. The parasitic inductance of the electronic component 150 was 175 pH. The parasitic inductance of the partial pattern 454A was 53 pH. The sum of the parasitic inductance of the via 455 and the parasitic inductance of the partial pattern 454B was 89 pH.

As these simulation results indicate, the parasitic inductance of the first land 411 in the electronic component mounting structure according to the embodiment illustrated in FIG. 5 is larger than that in the electronic component mounting structure according to the reference example illustrated in FIGS. 9A to 9C and FIG. 10. In the electronic component mounting structure according to the embodiment illustrated in FIG. 5, the mutual inductance between the second partial pattern 414B and first electrode 101 sufficiently reduces the parasitic inductance of the electronic component 100 and the parasitic inductance of the second partial pattern 414B. Accordingly, the parasitic inductance of the electronic component mounting structure according to the embodiment illustrated in FIG. 5 is sufficiently reduced compared to that of the electronic component mounting structure according to the reference example illustrated in FIGS. 9A to 9C and FIG. 10.

Figure 8:
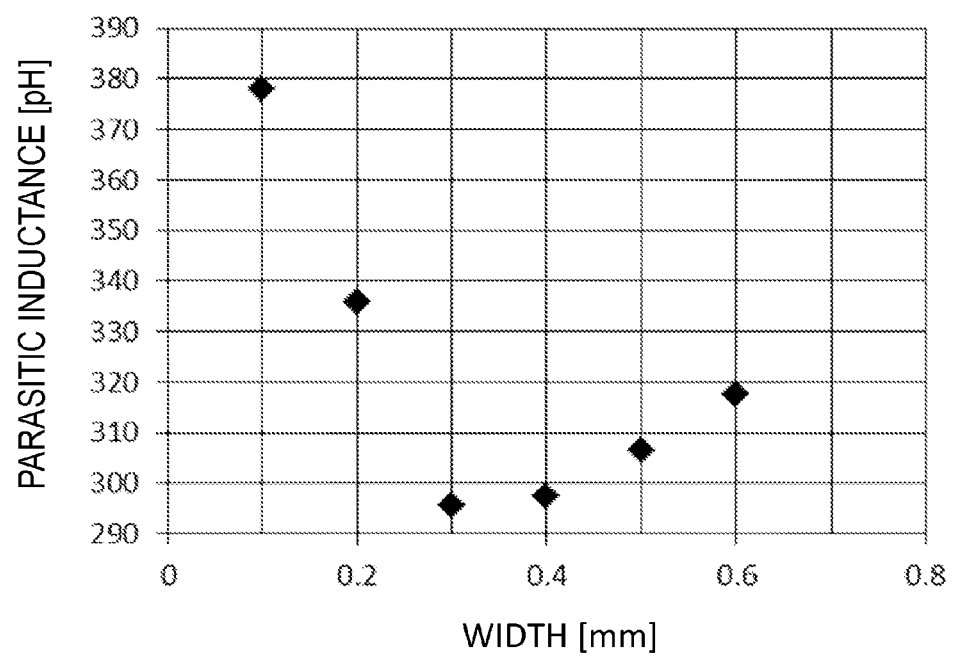
FIG. 8 is a graph illustrating simulation results indicating the relationship between the width of a second partial pattern of a second wiring pattern and the parasitic inductance.

FIG. 8 is a graph illustrating simulation results indicating the relationship between the width W of the second partial pattern of the second wiring pattern and the parasitic inductance of the electronic component mounting structure. The abscissa of FIG. 8 indicates the width W of the second partial pattern 404B, 414B, 424B and 434B of the second wiring pattern 404, 414, 424 and 434. Note that in the electronic component mounting structure according to the modification 2 illustrated in FIG. 6, the sum of the width $W_a$ of the divided pattern 424Ba and the width $W_b$ of the divided pattern 424Bb is equivalent to the width W of the second partial pattern indicated by the abscissa in FIG. 8. The ordinate of FIG. 8 indicates the parasitic inductance of the electronic component mounting structure.

As illustrated in FIG. 8, when the width W of the second partial pattern 404B, 414B, 424B and 434B of the second wiring pattern 404, 414, 424 and 434 is increased from 0.1 mm to 0.3 mm, the parasitic inductance of the electronic component mounting structure is reduced. The reason why the parasitic inductance thus reduces is that the opposed area between the electronic component 100 and the second partial pattern 404B, 414B, 424B and 434B is increased in accordance with that the width W of the second partial pattern 404B, 414B, 424B and 434B is increased. The mutual inductance between the electronic component 100 and the second partial pattern 404B, 414B, 424B and 434B is increased by increasing the opposed area between the electronic component 100 and the second partial pattern 404B, 414B, 424B and 434B. Since the mutual inductance between the electronic component 100 and the second partial pattern 404B, 414B, 424B and 434B is increased, the parasitic inductances of the electronic component 100 and second wiring patterns 404, 414, 424 and 434 are reduced.

On the other hand, as illustrated in FIG. 8, when the width W of the second partial pattern 404B, 414B, 424B and 434B of the second wiring pattern 404, 414, 424 and 434 is increased from 0.3 mm to 0.6 mm, the parasitic inductance of the electronic component mounting structure is increased. The reason why the parasitic inductance thus increases is that the width of the first land 401, 411, 421 and 431 is decreased in accordance with that the width W of the second partial pattern 404B, 414B, 424B and 434B is increased. When the width of the first lands 401, 411, 421 and 431 are decreased, the self-inductances of the first land 401, 411, 421 and 431 are increased, and as a consequence the parasitic inductance is increased.

As illustrated in FIG. 8, when the width W of the second partial pattern of the second wiring pattern is within a range of 0.2 to 0.6 mm, the parasitic inductance of the electronic component mounting structure is lower by 10% or more than that when the width W of the second partial pattern of the second wiring pattern is 0.1 mm.

The relationship between the width W of the second partial pattern of the second wiring pattern and the parasitic inductance of the electronic component mounting structure is determined by the geometrical relationship between the size of the electronic component and that of the wiring pattern. Therefore, regardless of whether the size of the electronic component mounting structure increases or decreases, the same result is obtained if the geometrical relationship remains unchanged.

Accordingly, the parasitic inductance can sufficiently be reduced when the width W of the second partial pattern 404B, 414B, 424B and 434B of the second wiring pattern 404, 414, 424 and 434 is set within the range of ¼ to ¾ the width of the first electrode 101 of the electronic component 100.

Modified Embodiments

The present invention is not limited to the above-mentioned embodiment, and various modifications can be made.

For example, the above embodiment has been explained by the case in which the pair of electrodes 101 and 102 are formed on the short sides of the electronic component 100 as an example, but the pair of electrodes 101 and 102 may also be formed on the long sides of the electronic component 100. In this case, the width of the first land 402, 412, 422, and 432 and the width of the second partial pattern 404B, 414B, 424B, and 434B is increased in comparison with the structure in which the pair of electrodes 101 and 102 are formed on the short sides of the electronic component 100. In this case, a more inexpensive printed wiring board can be used as the printed wiring board 200 because the degree of micropatterning of wiring patterns required for the printed wiring board 200 is decreased.

Also, the above embodiment has been explained by the case in which the electronic component 100 is a chip capacitor as an example, but the electronic component 100 may also be a chip resistor. The chip resistor is used to, e.g., generate a reference voltage of an electronic circuit. When a high-frequency noise current is generated in a wiring pattern connected to the chip resistor, a noise voltage corresponding to the integrated value of the parasitic inductance and the noise current is generated, and the reference voltage becomes unstable. When the present invention is applied to mounting of the chip resistor to be used to generate the reference voltage, the parasitic inductance is reduced, and the noise voltage is reduced. Consequently, the stability of the reference voltage can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-261587, filed Dec. 18, 2013, which is hereby incorporated by reference herein in its entirety.

What is claimed is:

1. An electronic component mounting structure comprising:
   a first land formed on a printed wiring board;
   a second land formed on the printed wiring board;
   an electronic component including a pair of electrodes formed on both sides of a body, a first electrode as one of the pair of electrodes being connected to the first land, and a second electrode as the other one of the pair of electrodes being connected to the second land;
   a first wiring pattern connected to the first land; and
   a second wiring pattern connected to the second land and including a first partial pattern overlapping a portion of the body of the electronic component in planar view, the portion being not covered with the pair of electrodes, a second partial pattern formed integral with the first partial pattern and overlapping the first electrode of the electronic component in planar view, and a third partial pattern formed integral with the second partial pattern and parallel to the first wiring pattern,
   wherein the first land, the second land, the first wiring pattern and the second wiring pattern are formed in an uppermost conductor layer of the printed wiring board.

2. An electronic component mounting structure according to claim 1, wherein
   the first land is divided into a first divided pattern and a second divided pattern, and
   the second partial pattern is positioned between the first divided pattern and the second divided pattern.

3. An electronic component mounting structure according to claim 1, wherein
   the second partial pattern is divided into a third divided pattern and a fourth divided pattern, and
   the first land is positioned between the third divided pattern and the fourth divided pattern.

4. An electronic component mounting structure according to claim 1, wherein
   a dimension of the second partial pattern in a longitudinal direction of the second land falls within a range of ¼ to ¾ a dimension of the first electrode in the longitudinal direction of the second land.

5. A printed wiring board comprising:
   a first land to be connected to a first electrode of one of a pair of electrodes formed on both sides of a body of an electronic component when the electronic component is mounted;
   a second land, the second land being connected to a second electrode as the other one of the pair of electrodes when the electronic component is mounted;
   a first wiring pattern connected to the first land; and
   a second wiring pattern connected to the second land and including a first partial pattern formed to overlap a portion of the body of the electronic component in planar view, the portion being not covered with the pair of electrodes, a second partial pattern formed integral with the first partial pattern and formed so as to overlap the first electrode of the electronic component in planar view, and a third partial pattern formed integral with the second partial pattern and parallel to the first wiring pattern,
   wherein the first land, the second land, the first wiring pattern and the second wiring pattern are formed in an uppermost conductor layer of the printed wiring board.

6. A printed wiring board according to claim 5, wherein
   the first land is divided into a first divided pattern and a second divided pattern, and
   the second partial pattern is positioned between the first divided pattern and the second divided pattern.

7. A printed wiring board according to claim 5, wherein
   the second partial pattern is divided into a third divided pattern and a fourth divided pattern, and
   the first land is positioned between the third divided pattern and the fourth divided pattern.

* * * * *